United States Patent [19]

Williams

[11] Patent Number: 4,644,378
[45] Date of Patent: Feb. 17, 1987

[54] SEMICONDUCTOR DEVICE FOR GENERATING ELECTROMAGNETIC RADIATION

[75] Inventor: Ferd E. Williams, Newark, Del.

[73] Assignee: U.S. Philips Corporation, New York, N.Y.

[21] Appl. No.: 816,972

[22] Filed: Dec. 31, 1985

Related U.S. Application Data

[63] Continuation of Ser. No. 500,677, Jun. 3, 1983, abandoned.

[30] Foreign Application Priority Data

Apr. 7, 1983 [NL] Netherlands ............... 8301215

[51] Int. Cl.$^4$ ............................................. H01L 33/00
[52] U.S. Cl. ............................................ 357/17; 357/4; 357/16; 372/45; 372/46
[58] Field of Search ............. 357/17, 16, 61, 4, 4 SL; 372/45, 46

[56] References Cited

U.S. PATENT DOCUMENTS 3,982,207  9/1976  Dingle et al. ............ 357/16
4,439,782  3/1984  Holonyak, Jr. ........... 357/16

Primary Examiner—James W. Davie
Assistant Examiner—Georgia Y. Epps
Attorney, Agent, or Firm—Robert T. Mayer; Steven R. Biren

[57] ABSTRACT

A semiconductor LED or laser, having an active layer-shaped region composed of a layer structure comprising active layers and barrier layers. The layer structure constitutes a superlattice structure. Both the active layers and the barrier layers consists of either a stoichiometric semiconductor compound or a semi-conductor element. According to the invention, the active layers consist of n monolayers and the barrier layers consist of m monolayers, where $2 \leq n \leq 7$, $2 \leq m \leq 7$ and $n+m \leq 12$, in order to obtain an optimum combination of zone-folding effect and quantum well effect. In this manner, superior lasers and LED's for wave-lengths in the visible part of the spectrum can be realized.

5 Claims, 3 Drawing Figures

SEMICONDUCTOR DEVICE FOR GENERATING ELECTROMAGNETIC RADIATION

This is a continuation of application Ser. No. 500,677, filed June 3, 1983, now abandoned.

BACKGROUND OF THE INVENTION

The invention relates to a semiconductor device for generating electromagnetic radiation in an active layer-shaped semiconductor region, in which the active region is composed of a layer structure having active layers of a first semiconductor material and of substantially equal thicknesses, which are located between and are separated by barrier layers of a second semiconductor material and of likewise substantially equal thicknesses having a larger energy gap than the first semiconductor material, both the active layers and the barrier layers comprising either a stoichiometric semiconductor compound or a semiconductor element and together constituting a superlattice structure.

A semiconductor device as described above is known from the international (PCT) Patent Application WO No. 82-03946 published on Nov. 11$^{th}$, 1982.

Semiconductor devices for producing electromagnetic radiation are used in various fields. They are known in two types, i.e. devices whose emitted radiation is non-coherent and devices whose emitted radiation is coherent. The former devices are mostly designated as LED's (Light-Emitting Diodes), while the latter devices are designated as lasers. The wave-length of the emitted radiation can be situated in the visible part of the spectrum, but also, for example, in the infrared or ultraviolet part.

The pn-semiconductor lasers mostly used hitherto are so-called double hetero-junction (DH) lasers having a layer-shaped active region consisting of gallium arsenide or gallium aluminum arsenide situated between two cladding layers of gallium-alluminum arsenide of opposite conductivity type and having a larger energy gap (due to a higher aluminum content) than the active region. The gallium-aluminum arsenide used then has the composition $Al_xGa_{1-x}As$, where $x \leq 0.45$. In this interval for the atomic fraction x, the material is a so-called direct-gap semiconductor, which is a requirement for the occurrence of laser amplification.

The radiation produced by the aforementioned semiconductor lasers has (in air) a wave-length of about 800 nm, in the infrared part of the spectrum. However, lasers and LED's producing radiation of a shorter wavelength, for example in the green, orange or visible red part, (620 nm) are in high demand. This is especially the case with the use of lasers for optically recording information on disks ("digital optical recording" or DOR), whereby holes are burned into a reflection layer by means of a laser beam. The attainable density of the stored information then increases in inverse proportion to the square of the wave-length of the radiation used. A decrease of the wave-length from, for example, 800 nm to 600 nm thus causes the density of the information that can be written to be approximately doubled.

In the aforementioned PCT Application No. 82,03946, a laser structure is described in which the layer-shaped active region consists of a comparatively large number of active layers of a stoichiometric semiconductor compound having a direct band gap, such as gallium arsenide, which are located between and are mutually separated by barrier layers of a stoichiometric semiconductor compound having an indirect band gap, such as aluminum arsenide. These active layers and barrier layers together constitute a so-called superlattice which has an effective energy gap lying between that of GaAs (1.35 eV) and that of AlAs (2.30 eV), i.e. 1.57 eV, so that the radiation produced has considerably shorter wave-length than would be the case with the use of an active layer consisting solely of gallium arsenide. This effect is attained by the occurrence of the so-called "quantum well" effect and of the "zone folding" effect in the active region.

The "quantum well" effect occurs when a very thin layer of a first semiconductor material is enclosed between two layers of a second semiconductor material having a larger energy gap than the first semiconductor material. It results in the effective energy gap in the very thin layer of the first material becoming larger and hence the wave-length of the radiation produced becoming smaller. The "zone folding" effect occurs due to the superlattice structure and results in the conversion of "indirect" semiconductor material into semiconductor material which is effectively "direct" with respect to the band transitions of charge carriers. This increases the radiating transition probability of the charge carriers so that a high radiation density can be attained. For a description of the "quantum well" effect, reference is invited inter alia to the article by Holonyak et al in IEEE Journal of Quantum Electronics. Vol. QE 16, 1980, p. 170–184.

For a description of the "zone folding" effect, reference is invited, for example, to the article by Osbourn et al in Applied Physics Letters, Vol. 41, (1982), p. 172–174.

The superlattice structure according to the aforementioned PCT Application WO No. 82-03946 consists of active GaAs layers having a thickness between 2 nm and 50 nm mutually separated by barrier layers of AlAs having a thickness between 1 nm and 20 nm. However, this combination of layer thicknesses is not suitable to obtain an optimum combination of "quantum well" effect and "zone folding" effect.

SUMMARY OF THE INVENTION

The invention has inter alia for its object to provide a superlattice structure for LED's or lasers, in which radiation of shorter wave-length is produced with a higher radiation density for a given current than in known pn-semiconductor lasers.

According to the invention, a semiconductor device of the kind mentioned above is therefore characterized in that the active layers have a thickness of n monolayers and the barrier layers have a thickness of m monolayers, where n and m are integers and satisfy the condition $2 \leq n \leq 7$, $2 \leq m \leq 7$ and $n+m \leq 12$.

The invention is based inter alia on the recognition of the fact that, in order to obtain an optimum combination of the "quantum well" effect and the "zone folding" effect, the active layers and the barrier layers both have to be very thin. The minimum permissible thickness of two mono-layers is the minimum thickness at which at least part of the cation atoms in the active layers and at least part of the cation atoms in the barrier layers have as adjacent cation atoms only atoms of their own nature, as a result of which the properties of these layers are approximately equal to those of the corresponding "bulk" material. The maximum thickness of seven monolayers is that at which the active layers are still sufficiently thin to exhibit a strong quantum well effect, while the barrier layers are sufficiently thin to guarantee that the active layers "see" each other sufficiently to produce a pronounced "zone folding" effect.

The condition $n+m \leq 12$ is based on the consideration that with $n+m \leq 12$ the wave functions of electrons is adjacent quantum wells do not overlap each other within the intermediate barrier layer to a sufficient extent so that only individual quantum wells are obtained and the desired co-operation between the quantum well effect and the zone folding effect does not occur.

For the $A^{III}B^{V}$ semiconductor compounds suiting the purpose, the aforementioned conditions will generally imply that the thicknesses of both the active layers and the barrier layers are at least equal to 0.6 nm and at most equal to 1.7 nm.

According to a first preferred embodiment, the active layers consist of gallium arsenide and the barrier layers of aluminum arsenide. A laser having an active region composed in this manner has a radiation having a wave-length in the red of approximately 635 nm (effective energy gap 1.95 eV).

According to another preferred embodiment, active layers of gallium phosphide (GaP) and barrier layers of aluminium phosphide (AlP) are used. Thus, a laser having a radiation wave-length in the green of approximately 530 nm can be manufactured (effective energy gap 2.34 eV).

The invention is not limited to semiconductor lasers, but can also be used in radiation-emitting diodes (LED's) producing non-coherent radiation. In this case, the layer-shaped active region need not be interposed between cladding layers having a larger energy gap. However, the invention is of particular advantage for semiconductor lasers, in which the layer-shaped active semiconductor region lies between two semiconductor layers having a larger energy gap than the effective energy gap of the active region. These passive semiconductor layers or cladding layers, which serve to confine the radiation to the active region, are in most of the laser structures of opposite conductivity type, but this does not apply to all lasers, for example, not to lasers of the TJS (Transverse Junction Stripe) type, as described in U.S. Pat. No. 3,961,996.

BRIEF DESCRIPTION OF THE DRAWING

The invention will now be described more fully with reference to several embodiments and the drawing, in which.

Corresponding parts are generally designated by the same reference numerals. Semiconductor regions of the same conductivity type are generally hatched in the same direction.

DESCRIPTION OF THE PREFERRED EMBODIMENTS

Figure 1:
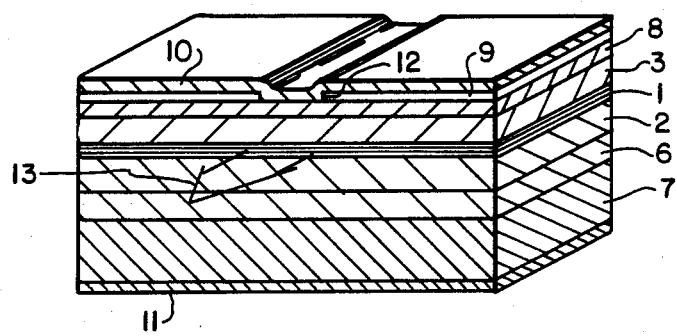
FIG. 1 shows, partly diagrammatically in cross-section and partly in perspective view, a semiconductor device according to the invention.

FIG. 1 shows, partly diagrammatically in cross-section and partly in perspective view, a semiconductor device for generating electromagnetic radiation according to the invention. The semiconductor device shown herein is a semiconductor laser and comprises an active layer-shaped semiconductor region 1 lying between two semiconductor cladding layers 2 and 3 having a larger energy gap than the effective energy gap of the active region 1.

Figure 2:
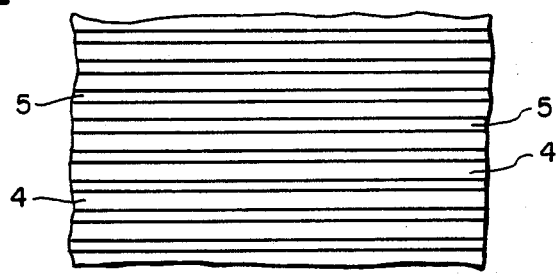
FIG. 2 shows diagrammatically in cross-section a detail of the device shown in FIG. 1.

The said active region 1 is composed of a layer structure shown diagrammatically in cross-section in FIG. 2. FIG. 2 shows a part of the layer 1, which consists of active layers 4 of a first semiconductor material, in this example of undoped gallium arsenide, having approximately equal thicknesses. The active layer 4 lie between and are separated by barrier layers 5 of a second semiconductor material, in this example of undoped aluminum arsenide, likewise having approximately equal thicknesses. The energy gap of aluminium arsenide is 2.30 eV, which is larger than that of the gallium arsenide layers 4 (1.35 eV). The active-layers 4 and the barrier layers 5 together constitute superlattice structure.

According to the invention, the thickness of the active layers 4 and also the thickness of the barrier layers 5 are at least equal to two and at most equal to seven mono-layers of the material of which these respective layers consist. In this example, the active layers 4 have a thickness of 1.46 nm, which corresponds to six monolayers of GaAs. The barrier layers 5 in this example have a thickness of 0.97 nm, which corresponds to four monolayers of AlAs. The thickness of a GaAs monolayer is in fact 0.244 nm and that of an AlAs mono-layer is 0.243 nm; see C, Hilsum and A. C. Rose-Innes, Semiconducting III-V Compounds, Pergamon Press, 1961, p. 6, Table 2.I. The total number of GaAs- and AlAs mono-layers according to the invention does not exceed twelve, i.e. in this example $6+4=10$. In this example, a total number of fourteen active layers 4 and fifteen barrier layers 5 are applied. These layers together constitute a superlattice of approximately 35 nm thickness. For radiation production the effective energy gap Eg of this superlattice is 1.95 eV.

This effective energy gap corresponds to a wavelength (in air or in a vacuum) of the generated radiation of 635 nm.

The laser described in this example is, except for the active region 1, entirely constructed as a conventional laser of the so-called double hetero-junction type. The layer-shaped regions 2, 1 and 3 are provided on an epitaxial layer 6 of n-type aluminum arsenide having a thickness of 2 $\mu$m and a doping concentration of $2.10^{17}$ selenium atoms/cm$^3$, which in turn is provided on a (100) orientated substrate 7 of n-type gallium arsenide having a doping concentration of $2.10^{18}$ silicon atoms/cm$^3$. The layer 2 is a layer of n-type aluminum arsenide having a thickness of 1.5 $\mu$m and a doping concentration of $10^{18}$ selenium atoms/cm$^3$. The layer 3 is a p-type aluminum arsenide layer having a thickness of 1.5 $\mu$m and a doping concentration of $2.10^{17}$ zinc atoms/cm$^3$. Finally, a further contact layer 8 of p-type gallium arsenide having a thickness of 1 $\mu$m and a doping concentration of $2.10^{19}$ zinc atoms/cm$^3$ is provided on the layer 3.

In order to form a strip-shaped active region in the layer 1 in the operating condition, in the laser according to this example the layer 8 is coated with a layer 9 of silicon oxide, into which a strip-shaped aperture 12 is etched. Within this aperture an electrode layer 10 is in contact with the layer 3. An electrode layer 11 is provided on the lower side of the substrate 7.

The crystal surfaces at right angles to the strip-shaped aperture 12 are cleavage surfaces and serve as mirror surfaces for the laser. With a sufficiently high current between the anode 10 and the cathode 11, a coherent radiation beam 13 is generated having a wave-length of 635 nm.

The semiconductor layer shown in FIGS. 1 and 2 can be realized by means of different methods of epitaxial growth. The methods of "molecular beam epitaxy" (MBE) and of "metallo-organic chemical vapor deposition" (MOCVD) are particularly suitable. The former of these method is described inter alia in U.S. Pat. No. 4,261,771 and the latter method in the acticle of Kasemset et al in Applied Physics Letters, Vol. 41, No. 10, Nov. 15th 1982, p. 912–914. Thus, for example, with the use of the MBE technique, the following procedure may be applied.

The starting member is an n-type gallium arsenide substrate 7 having a doping concentration of $2.10^{18}$ silicon atoms/cm$^3$ and a (100) orientation. By means of known methods of epitaxial growth, an n-type AlAs layer 6 having a thickness of 2 μm and a doping concentration of $2.10^{17}$ selenium atoms/cm$^3$ and then an n-type layer 2 of AlAs having a doping concentration of $10^{18}$ selenium atoms/cm$^3$ are grown on this substrate. Subsequently, the whole is placed in a chamber of an apparatus for MBE growth. At a substrate temperature of approximately 600° C. and pressure of approximately $0.133 \times 10^{-8}$ kPa ($10^{-8}$ Torr), 0.97 nm thick barrier layers 5 of undoped AlAs and 1.46 nm thick active layers 4 of undoped GaAs are then grown alternately up to a total number of fifteen barrier layers 5 and fourteen active layers 4. Subsequently, a p-type layer 3 of AlAs having a thickness of 1.5 μm and a doping concentration of $2.10^{17}$ zinc atoms/cm$^3$ and a p-type GaAs layer 8 having a thickness of 1 μm and a doping concentration of $2.10^{19}$ zinc atoms/cm$^3$ are grown successively on this superlattice structure.

Thereafter, an insulating layer 9 of, for example, silicon oxide having a thickness of 0.1 μm is deposited on the surface of the layer 8. After strip-shaped windows 12 have been etched into this oxide layer 9, an electrode layer 10 is deposited, after which the cleavage surfaces constituting the mirror surfaces of the lasers obtained are formed by scribing and breaking. An electrode layer 11 is deposited on the substrate 7 and the laser is provided on a heat sink with one of the electrode layers, perferably with the electrode layer 10 located closest to the active region 1, and is then finished in usual manner.

As has been stated, the invention may also be used in light-emitting diodes. In the following example, such a diode will be described for generating non-coherent radiation having a wave-length of approximately 530 nm (green).

Figure 3:
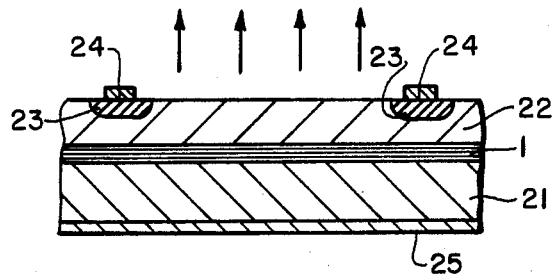
FIG. 3 shows diagrammatically in cross-section another semiconductor device according to the invention. The Figures are shown purely schematically and are not drawn to scale, and in particular the dimensions in the direction of thickness are strongly exaggerated.

FIG. 3 shows diagrammatically in cross-section such a diode. The active layer-shaped region 1 in this case is also a superlattice structure having a configuration as shown in FIG. 2. In this case, however, the active layers 4 consist of gallium phosphide (GaP), while the barrier layers 5 consist of aluminum phosphide (AlP). The number (n) of monolayers of the active GaP layers is four and the number (m) of the AlP barrier layers is also four. The thickness of a GaP monolayer is 0.236 nm and the thickness of an AlP monolayer is also 0.236 nm. Also in this case, the conditions $2 \leq n \leq 7$, $2 \leq m \leq 7$ and $n+m \leq 12$ are satisfied. The energy gap of GaP is 2.25 eV and that of AlP is 2.5 eV. The effective energy gap of the active region 1 is 2.34 eV. The total number of active layers 4 is fourteen and the total number of barrier layers is fifteen. The (green) light leaves the diode along the arrows via the part of the upper surface located within the annular elctrode (anode) 24 with the associated annular p$^+$-type contact zone 23. The active region 1 lies between a highly doped n-type substrate 21 of gallium phosphide and the p-type layer 22 of aluminum phosphide having a thickness of approximately 1 μm and a doping concentration of approximately $10^{17}$ zinc atoms/cm$^3$. On the lower side of the substrate 21 is provided an electrode layer (cathode) 25.

Many variations are possible within the scope of the invention for those skilled in the art. For example, the number of monolayers of which the active layers 4 and the barrier layers 5 are composed, may be varied within the limits set by the invention. The layer structure shown in FIG. 1 may also be used as a source of non-coherent radiation in the absence of mirror surfaces. In the embodiments, the conductivity types of the various layers may be replaced (at the same time) by the opposite types. The wave-length of the generated radiation may then vary Further, the total number of the active layers and barrier layers in the superlattice structure may be chosen larger or smaller than fifteen. Dependent upon the desired wave-length, both the aforementioned parameters and the semi-conductor materials of the various layers may be varied within the limits set by the invention and the technological possibilities. For example, instead of stoichiometric III–V compounds, stoichiometric II–VI compounds and/or elementary semiconductors, such as germanium, may be used.

What is claimed is:

1. In a semiconductor device for generating electromagnetic radiation in an active layer-shaped semiconductor region, the active region comprises a layered structure comprising active layers of a first semiconductor material having substantially equal thicknesses which are located between and separated by barrier layers of a second semiconductor material having substantially equal thicknesses and having a larger energy gap than that of said first semiconductor material, both said active layers and said barrier layers comprising a semiconductor material selected from the group consisting of a stoichiometric semiconductor compound and a semiconductor element, and together comprising a super-lattice structure, characterized in that said active layers have a thickness of n monolayers and said barrier layers have a thickness of m monolayers, where n and m are integers and satisfy the conditions: $2 \leq n \leq 7$, $2 \leq m \leq 7$ and $n+m \leq 12$, and in that the combined thickness of one active layer and one barrier layer is greater than about 1.1 nm but less than about 3.5 nm.

2. In a semiconductor device as claimed in claim 1, characterized in that the thickness of said active layers and the thickness of said barrier layers is at least equal to 0.6 nm and is at most equal to 1.7 nm.

3. In a semiconductor device as claimed in claim 1 or 2, characterized in that said active layers comprise gallium arsenide and said barrier layers comprise aluminum arsenide.

4. In a semiconductor device as claimed in claim 1 or 2, characterized in that said active layers consist of gallium phosphide and said barrier layers comprise aluminum phosphide.

5. In a semiconductor device as claimed in claim 1 or 2, characterized in the said device is a semiconductor laser, and said layer-shaped active semiconductor region lying between two semiconductor cladding layers has a larger energy gap than that of the effective energy gap of said active region.

* * * * *